United States Patent
Then et al.

(10) Patent No.: US 10,622,448 B2
(45) Date of Patent: Apr. 14, 2020

(54) TRANSISTORS INCLUDING RETRACTED RAISED SOURCE/DRAIN TO REDUCE PARASITIC CAPACITANCES

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US); Sanaz K. Gardner, Portland, OR (US); Seung Hoon Sung, Portland, OR (US)

(73) Assignee: Intel Corproation, Santa Clara, CA (US)

( * ) Notice: Subject to any disclaimer, the term of this patent is extended or adjusted under 35 U.S.C. 154(b) by 0 days.

(21) Appl. No.: 16/080,100

(22) PCT Filed: Mar. 30, 2016

(86) PCT No.: PCT/US2016/024938
§ 371 (c)(1),
(2) Date: Aug. 27, 2018

(87) PCT Pub. No.: WO2017/171752
PCT Pub. Date: Oct. 5, 2017

(65) Prior Publication Data
US 2019/0058042 A1 Feb. 21, 2019

(51) Int. Cl.
*H01L 29/15* (2006.01)
*H01L 31/0256* (2006.01)
(Continued)

(52) U.S. Cl.
CPC ...... *H01L 29/2003* (2013.01); *H01L 29/0607* (2013.01); *H01L 29/0847* (2013.01);
(Continued)

(58) Field of Classification Search
None
See application file for complete search history.

(56) References Cited

U.S. PATENT DOCUMENTS

2006/0113603 A1* 6/2006 Currie ................ H01L 27/1203
257/368
2008/0054352 A1* 3/2008 Imoto ............... H01L 21/26586
257/330
(Continued)

FOREIGN PATENT DOCUMENTS

WO  2016/024960 A1  2/2016
WO  2017/171752 A1  10/2017

OTHER PUBLICATIONS

International Search Report and Written Opinion received for PCT Application No. PCT/US2016/024938, dated Dec. 8, 2016. 14 pages.
(Continued)

*Primary Examiner* — Calvin Y Choi
(74) *Attorney, Agent, or Firm* — Finch & Maloney PLLC

(57) ABSTRACT

Techniques are disclosed for forming transistors including retracted raised source/drain (S/D) to reduce parasitic capacitance. In some cases, the techniques include forming ledges for S/D epitaxial regrowth on a high-quality crystal nucleation surface. The techniques may also include forming the raised sections of the S/D regions (e.g., the portions adjacent to spacer material between the S/D regions and the gate material) in a manner such that the S/D raised sections are retracted from the gate material. This can be achieved by forming a notch at the interface between a polarization charge inducing layer and an oxide layer using a wet etch process, such that a relatively high-quality surface of the polarization charge inducing layer material is exposed for S/D regrowth. Therefore, the benefits derived from growing the S/D material from a high-quality nucleation surface can be retained while reducing the parasitic overlap capacitance penalty that would otherwise be present.

20 Claims, 7 Drawing Sheets

(51) Int. Cl.
*H01L 29/20* (2006.01)
*H01L 29/66* (2006.01)
*H01L 29/08* (2006.01)
*H01L 29/78* (2006.01)
*H01L 29/778* (2006.01)
*H01L 29/06* (2006.01)
*H01L 29/423* (2006.01)

(52) U.S. Cl.
CPC .... *H01L 29/66462* (2013.01); *H01L 29/7786* (2013.01); *H01L 29/7787* (2013.01); *H01L 29/78* (2013.01); *H01L 29/4236* (2013.01)

(56) References Cited

U.S. PATENT DOCUMENTS

| | | |
|---|---|---|
| 2011/0291202 A1 | 12/2011 | Cheng et al. |
| 2012/0025282 A1 | 2/2012 | Doris et al. |
| 2013/0082311 A1* | 4/2013 | Cheng ................. H01L 29/7834 257/288 |
| 2013/0307513 A1* | 11/2013 | Then ................. H01L 29/66469 323/311 |
| 2014/0154846 A1 | 6/2014 | Cheng et al. |

OTHER PUBLICATIONS

International Preliminary Report on Patentability received for PCT Application No. PCT/US2016/024938, dated Oct. 2, 2018. 10 pages.

* cited by examiner

TRANSISTORS INCLUDING RETRACTED RAISED SOURCE/DRAIN TO REDUCE PARASITIC CAPACITANCES

BACKGROUND

In the fields of wireless communication and power management, various components can be implemented using solid-state devices including transistors. For example, in radio frequency (RF) communication, the RF front end is a generic term for the circuitry between an antenna and a digital baseband system. The RF front end may include multiple components, such as power amplifiers and low-noise amplifiers. A power amplifier, in the context of RF design, is a type of electronic amplifier that can convert a relatively low-power radio frequency signal into a signal of significant power. Such power amplifier devices may include bipolar junction transistors or metal-oxide-semiconductor field-effect transistors (MOSFETs), for example. A low-noise amplifier is an electronic amplifier that can amplify a relatively low power signal without significantly degrading the signal-to-noise ratio of the low power signal. Such low-noise amplifier devices may include junction FETs (JFETs) and high electron mobility transistors (HEMTs), for example. Transistors may also be used in voltage regulators and RF switches included in RF communication and power management applications.

Figure 1:
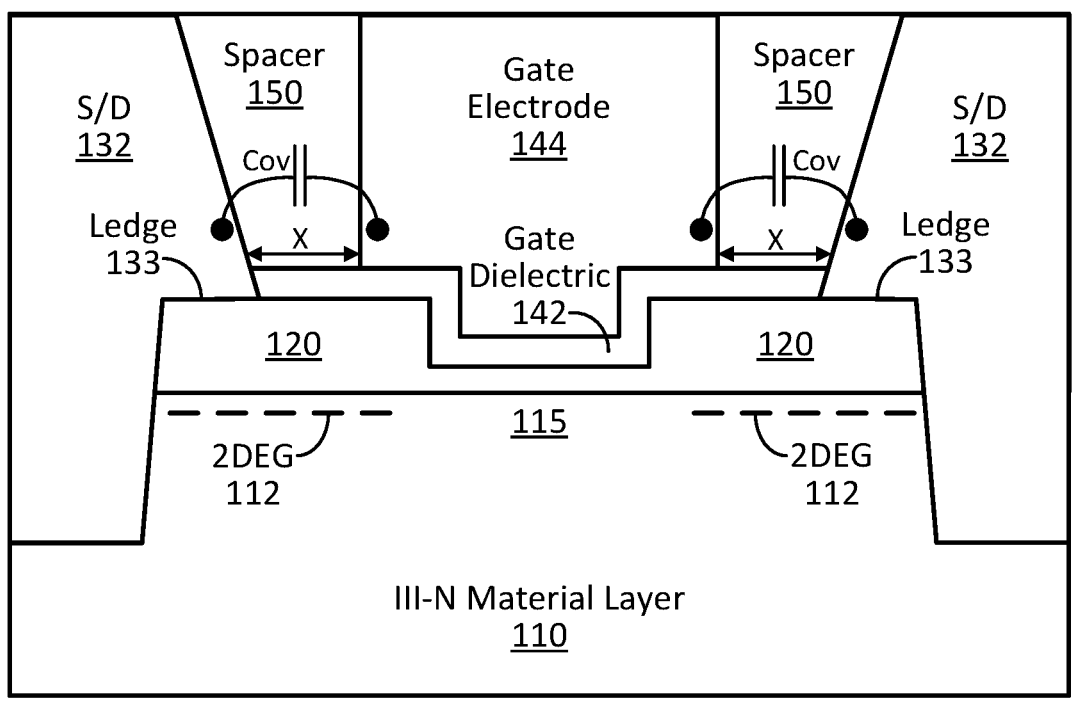
FIG. 1 illustrates a cross-sectional view of a transistor structure, where the cross-sectional view is along the orthogonal-to-gate direction.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming transistors including retracted raised source/drain (S/D) to reduce parasitic capacitance. As will be appreciated in light of this disclosure, a given source or drain region is said to be "retracted," in that the gate-facing side or edge of that S/D region does not gradually taper inward toward the channel, as is typically the case. Rather, the gate-facing side is relatively straight (compared to the gradual tapering) down to a finger-shaped ledge. The finger-shaped ledge is below the dielectric spacer layer between the S/D region and the gate, and provides a high-quality crystal nucleation surface for S/D epitaxial regrowth. This non-tapered or so-called retracted nature of the S/D regions allows the dielectric spacer distance between the S/D region and the gate to remain relatively wide, and therefore avoids or reduces the formation of parasitic capacitance between the S/D region and the gate (the combination of the dielectric spacer sandwiched between the S/D region and the gate can form a capacitor if the sandwiched dielectric spacer gets too thin by virtue of tapering). In some cases, the techniques include forming a notch at the interface between polarization charge inducing layer material and an oxide layer material using a selective etch process, as further explained herein. This notch provides the finger shape below the dielectric spacer layer, such that a relatively high-quality surface (or ledge) of the polarization charge inducing layer material is exposed for the S/D regrowth. Therefore, the benefits derived from growing the S/D material from a high-quality nucleation surface are retained while reducing or eliminating the parasitic capacitance that would otherwise be present, if the S/D region (and dielectric spacer layer) tapered inward toward the gate. Further, the reduction in parasitic capacitance can lead to transistor devices having improved cut-off frequency and maximum oscillation frequency, as well as improvements in performance for high-voltage and high-frequency applications. As will be apparent in light of this disclosure, the S/D material formed in the notch is referred to as an arm or arm portion of the S/D region, while the remainder of the S/D region is referred to as a main body portion. Numerous variations and configurations will be apparent in light of this disclosure.

General Overview

As previously described, transistors are used in multiple RF front end components, such as RFPAs and LNAs. For high frequency applications, transistor parasitic capacitance and transistor on-state resistance need to be minimized. However, minimizing both issues becomes more and more challenging as transistor dimensions are scaled to achieve high frequency operation. Reduction of source-to-gate and drain-to-gate distances come at the penalty of a larger overlap capacitance which acts as a critical parasitic component that degrades cut-off frequency (fT) and maximum oscillation frequency (fMAX) of a transistor. The use of raised regrown source/drain to reduce the on-state resistance further exacerbates this issue.

FIG. 1 illustrates a cross-sectional view of a transistor structure, where the cross-sectional view is along the orthogonal-to-gate direction. As can be seen in the example structure of FIG. 1, the transistor includes III-N material layer 110 having channel region 115 therein, polarization charge inducing layer 120 on layer 110, source/drain (S/D) regions 132, gate stack including gate dielectric 142 and gate electrode 144, and spacer material 150 adjacent to either side of gate electrode 144. As can also be seen, the III-N material layer 110 and polarization charge inducing layer 120 create two-dimensional electron gas (2DEG) configurations 112. Note that III-N material as used herein includes a compound of one or more group III materials (e.g., aluminum, gallium, indium, boron, and/or thallium), with nitrogen. In one example configuration, the materials of the structure in FIG. 1 may include gallium nitride (GaN) for III-N layer 110, aluminum indium nitride (AlInN) for polarization charge inducing layer 120, and n-type doped indium gallium nitride (InGaN) for S/D regions 132. To achieve relatively good regrowth of the S/D material 132 for improved contact resistance to the III-N material 110 at the 2DEG configuration locations 112, ledges 133 may be created to provide a high-quality crystal nucleation surface for the epitaxial growth of the crystalline S/D material 132. The ledges 133 can be created using a wet etch process to remove spacer material 150 and gate dielectric material 142 (where both or either of the materials being removed may initially be hardmask material) at the ledge locations 133 after the source/drain trenches have been formed. In some cases, the selective wet etch process can be used to expose undamaged, relatively high-quality polarization charge inducing layer material 120 at the ledge locations, thereby providing relatively high-quality nucleation surfaces for epitaxial growth of the S/D material 132. However, this causes the separation distance X between the S/D regions 132 and the gate electrode material 144 to decrease in the sections of the S/D that are adjacent to spacer material 150, referred to herein as the raised sections of the S/D regions. This reduction in separation distance X incurs undesired parasitic overlap capacitance (Cov) on both sides of the gate electrode 144, as shown.

Thus, and in accordance with one or more embodiments of this disclosure, techniques are provided for forming transistors including retracted raised source/drain to reduce parasitic capacitance. In some embodiments, the techniques include forming ledges for source/drain material regrowth on a high-quality nucleation surface, such as is shown in FIG. 1. However, in some such embodiments, the techniques also include forming the raised section of the S/D regions (e.g., the portions adjacent to spacer material between the S/D regions and the gate material) in a manner such that they are retracted or pulled back from the gate material, such as compared to the transistor structure of FIG. 1. Thus, in such embodiments, the benefits derived from growing the source/drain material from a high-quality nucleation surface can be retained while reducing or eliminating the parasitic overlap capacitance (Cov) penalty that would otherwise be present, such as in the transistor structure of FIG. 1. Further, in such embodiments, the reduction in Cov penalty can lead to transistor devices having improved cut-off frequency (fT) and maximum oscillation frequency (fMAX), as well as improvements in performance for high-voltage and high-frequency applications.

In some embodiments, the techniques may be used to form transistors having a group III-N semiconductor material channel. As used herein, group III-N material or III-N material includes a compound of one or more group III elements (e.g., aluminum, gallium, indium, boron, thallium), with nitrogen. Accordingly, III-N material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN). Generally, as used herein, group III-V material or III-V material includes at least one group III element (e.g., aluminum, gallium, indium, boron, thallium) and at least one group V element (e.g., nitrogen, phosphorus, arsenic, antimony, bismuth). In some embodiments, III-N materials may be particularly well-suited for transistor channel material due to the materials having wide bandgaps and other desirable properties. In some embodiments, GaN may be particularly well-suited for transistor channel material due to its wide bandgap, high critical breakdown electric field, and high electron saturation velocity, making. For example, as a result of the favorable properties of III-N material (and in particular, GaN), III-N (or more specifically, GaN) channel transistors can be used for high-voltage and high-frequency RF power amplifiers, low-noise amplifiers, voltage regulators, and RF switches.

In some embodiments, the techniques may include forming a ledge on the polarization charge inducing layer above the III-N layer to be used for the transistor channel, as was done to form the structure in FIG. 1. However, in some embodiments, the techniques include using a selective wet etch process to target and remove material at a target interface between the top of the polarization charge inducing layer and overlaying oxide material (e.g., hardmask or gate dielectric material). As can be understood based on this disclosure, forming the bond to oxygen with the polarization charge inducing layer material (e.g., AlN) makes that target interface vulnerable to wet etching, using a suitable etchant such as tetramethylammonium hydroxide (TMAH), for example. In such embodiments, the selective etch may etch inward from S/D trenches (in a lateral direction) faster than it etches the thickness of the material (in a vertical direction), thereby creating a notch or groove in the structure at the target interface and exposing a portion of high-quality polarization charge inducing layer material. Further, in such embodiments, the S/D material can then be grown in the notch or groove and on the exposed high-quality polarization charge inducing layer material, creating S/D regions each having a main body portion and an arm portion. Such S/D region arm portions extend from the main body portion toward the other S/D region and into the notch or groove formed using the selective wet etch process. In some embodiments, each S/D region arm may have a length dimension in the direction of lateral extension away from the main body portion and a thickness dimension in a direction perpendicular to the extension direction, where the ratio of the maximum arm length to the maximum arm thickness is at least 0.5, 1, 1.5, 2, 2.5, 3, 3.5, 4, 4.5, 5, 6, 7, 8, 9, 10, 11, 12, 15, 20, 30, 40, or 50, or some other suitable minimum ratio, depending on the particular configuration. For instance, in some embodiments, the maximum arm length may be in the range of 10-100 nm, and the maximum arm thickness may be in the range of 2-20 nm, just to name some example ranges.

In some embodiments, as a result of the techniques for retracting or pulling back the raised sections of the S/D regions (e.g., the sections of the S/D regions that are adjacent to gate stack spacer material), the edge of each S/D raised section closest to the gate electrode material may be either substantially vertical or have a slope such that the edge moves toward the gate electrode material when moving up the edge (e.g., when moving away from the S/D arm portions), for instance. This can be compared to the edge of the S/D raised sections shown in the structure of FIG. 1, wherein the edges of those S/D raises sections closest to the gate electrode material slopes such that the top portion of the edge moves away from the gate electrode material when moving up the edge (e.g., when moving away from ledge 133), for example. In other words, in FIG. 1, the distance of separation X increases as you move up the thickness of spacer material 150, as a result of the shape of the S/D raised sections. In some embodiments, an edge of each S/D raised section closest to the gate electrode material may be substantially parallel to an edge of the gate electrode material closest to the respective S/D raised section, such that the angles of inclination of the two edges are within 1, 2, 3, 4, 5, 6, 7, 8, 9, 10, 11, 12, 13, 14, or 15 degrees of each other, or some other suitable maximum degree amount, depending on the end use or target application.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, such tools may indicate transistor structures as described herein. For example, in some cases, a transistor structure including S/D arm portions as described herein may be apparent. In some cases, the angle of inclination of the edge of each S/D raised section can be compared to the angle of inclination of the closest gate electrode material edge to determine whether the edges are substantially parallel as described herein. In some cases, use of the techniques described herein may be detected based on the benefits derived. For example, in some cases, the improvement gained in overlap capacitance between the S/D region and the gate electrode material may be measured to detect use of the techniques described herein. Also, in some cases, the improvement gained in fT and/or fMax of a high-voltage and/or high-frequency transistor-based device may be measured to detect use of the techniques described herein. Numerous configurations and variations will be apparent in light of this disclosure.

Architecture and Methodology

FIGS. 2A-G illustrate example integrated circuit structures resulting from a method configured to form a transistor including retracted raised source/drain regions, in accordance with some embodiments of this disclosure. Note that the views shown are cross-sectional views taken along the orthogonal-to-gate direction of FIG. 2G. The techniques described herein, and the structures depicted in FIGS. 2A-G, are primarily in the context of a planar transistor configuration. However, in some embodiments, the techniques can be used to form transistors including a non-planar configuration, such as finned or finFET configurations (e.g., including a dual-gate or tri-gate configuration) or gate-all-around configurations (e.g., including one or more nanowires or nanoribbons). Further, in some embodiments, the techniques can be used to form numerous different types of transistors, such as MOSFETs, tunnel-FETs (TFETs), or other suitable transistor architectures, depending on the end use or target application. Further yet, in some embodiments, the techniques can be used to form integrated circuits including p-type and/or n-type transistor devices, such as p-type MOSFET (PMOS), n-type MOSFET (NMOS), p-type TFET (PTFET), and/or n-type TFET (NTFET), to name some examples. Further still, in some embodiments, the techniques may be used to benefit either or both of p-type and n-type transistors included in complementary MOS (CMOS) or complementary TFET (CTFET) devices, for example. In some embodiments, the techniques may be used to benefit devices of varying scales, such as transistor devices having critical dimensions in the micrometer range or in the nanometer range (e.g., transistors formed at the 32, 22, 14, 10, 7, or 5 nm process nodes, or beyond)

Figure 2A:
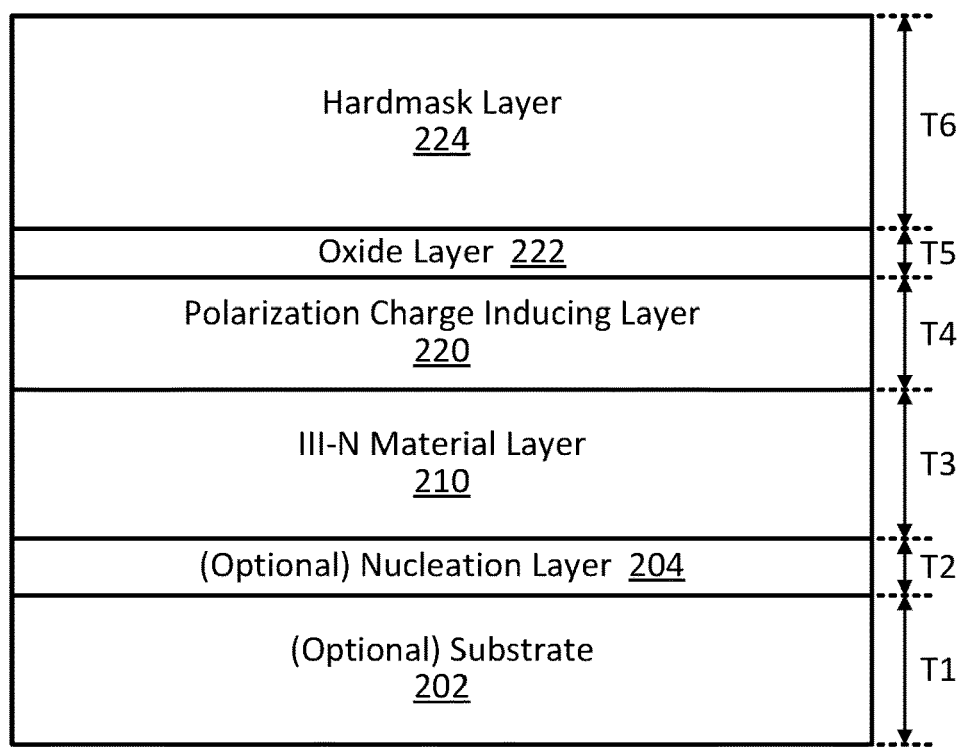
FIGS. 2A-G illustrate example integrated circuit structures resulting from a method configured to form a transistor including retracted raised source/drain regions, in accordance with some embodiments of this disclosure. Note that the structures shown are cross-sectional views taken along the orthogonal-to-gate direction of FIG. 2G.

FIG. 2A illustrates an example stack of layers that may be used to form a III-N channel transistor device including retracted raised source/drain (S/D) regions, in accordance with an embodiment. As shown, the stack of layers includes optional substrate 202, optional nucleation layer 204, III-N material layer 210, polarization charge inducing layer 220, oxide layer 222, and hardmask layer 224. Substrate 202 is optional, because in some embodiments, the III-N material layer 210 may be a bulk wafer, such that III-N material layer is the substrate and also serves as layer 210 as described herein. As will be apparent in light of this disclosure, III-N material layer 210 will include the transistor channel. Note that optional substrate 202 and optional nucleation layer 204 are not present in FIGS. 2B-G for ease of illustration. However, in some embodiments, those two layers 202 and 204 would be present below the base III-N material layer 210 shown in those figures. In some embodiments, formation of one or more of the layers in the stack of layers shown in FIG. 2A may be performed using metal-organic chemical vapor deposition (MOCVD), molecular-beam epitaxy (MBE) chemical vapor deposition (CVD), atomic layer deposition (ALD), physical vapor deposition (PVD), or any other suitable process as will be apparent in light of this disclosure.

In some embodiments, substrate 202 (where present) may include: a bulk substrate including a group IV material, such as silicon (Si), germanium (Ge), SiGe, or silicon carbide (SiC), and/or at least one group III-V material and/or sapphire and/or any other suitable material(s) depending on the end use or target application; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Although substrate 202, in this example embodiment, is shown as having a thickness (the vertical dimension) T1 similar to the other features for ease of illustration, in some instances, substrate 202 may be much thicker than the other features, such as having a thickness T1 in the range of 50 to 950 microns, for example. In some embodiments, substrate 202 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the transistor structures described herein may be included in a system-on-chip (SoC) application, as will be apparent in light of this disclosure.

In some embodiments, particularly where III-N layer 210 is formed on a non-III-V material substrate (e.g., on a Si, Ge, SiGe, SiC, or sapphire substrate), optional nucleation layer 204 may be formed between substrate 202 and III-N layer 210 to, for example, improve growth conditions and/or prevent the III-N layer 210 from reacting with the substrate material in an undesired manner. In some such embodiments, nucleation layer 204 may include a III-V semiconductor material, such as AlN or a low temperature GaN layer (e.g., epitaxially grown at a temperature in the range of 700 to 950 degrees Celsius), for example. In some embodiments, optional nucleation layer 204 may have a multilayer structure including multiple III-V materials. In some embodiments, optional nucleation layer 204 may or may not include grading (e.g., increasing and/or decreasing) the content of one or more materials in at least a portion of the layer. In some embodiments, nucleation layer 204, where present, may have any suitable thickness, such as a thickness $T2$ of 10 nm to 2 microns (e.g., 200 nm to 1 micron), or any other suitable thickness depending on the end use or target application.

In some embodiments, III-N layer 210 may include any suitable III-N material, such as GaN or InGaN, or any other suitable group III-N semiconductor material, depending on the end use or target application. As previously described, III-N material, as used herein, includes a compound of one or more group III materials (e.g., aluminum, gallium, and/or indium), with nitrogen. Accordingly, III-N materials as variously used herein include, but are not limited to, GaN, InN, AlN, AlInN, AlGaN, InGaN, and AlInGaN. In some embodiments, GaN may be particularly well-suited for III-N layer 210 because of its wide bandgap, high critical breakdown electric field, and high electron saturation. For example, embodiments employing GaN for the III-N layer 210 may be particularly well-suited for high-voltage and high-frequency applications, such as in the context of RF power amplifiers and low-noise amplifiers, to name some example devices. In some embodiments, III-N layer 210 may have a multilayer structure including multiple III-N materials. In some embodiments, III-N layer 210 may or may not include grading (e.g., increasing and/or decreasing) the content of one or more materials in at least a portion of the layer. In some embodiments, III-N layer 210 may be formed to have a thickness $T3$ between 50 nm and 2 microns, or any other suitable thickness, depending on the end use or target application. In embodiments where substrate 202 is not present and III-N layer 210 is a bulk wafer and thus also serves as the substrate, then III-N layer 210 may be substantially thicker, such as greater than 5 microns in thickness, for example.

In some embodiments, polarization charge inducing layer 220 may include any suitable materials, such as one or more III-V materials, and more specifically in some embodiments, one or more III-N materials (e.g., GaN, InN, AlN, AlInN, AlGaN, InGaN, and/or AlInGaN), for example. In some embodiments, polarization charge inducing layer 220 may include aluminum and indium, such that the layer includes at least one of AlN, AlGaN, InAlN, and InAlGaN, for instance. In some embodiments, polarization charge inducing layer 220 may increase carrier mobility in the transistor channel region and/or be used to form a 2DEG configuration with underlying III-N material layer 210, for example. In some embodiments, polarization charge inducing layer 220 may have a multilayer structure including multiple III-V materials. In some embodiments, polarization charge inducing layer 220 may or may not include grading (e.g., increasing and/or decreasing) the content of one or more materials in at least a portion of the layer. In some embodiments, polarization charge inducing layer 220 may have a thickness $T4$ of 0.1 to 100 nm (e.g., 0.5 to 5 nm), or any other suitable thickness, depending on the end use or target application.

In some embodiments, oxide layer 222 may include any suitable materials, such as one or more oxide materials, and more specifically in some embodiments, aluminum oxide, silicon dioxide, and/or a high-k oxide. In some such embodiments, high-k oxides include oxide material having a dielectric constant, k, greater than that of silicon dioxide (e.g., a k value greater than approximately 3.9). For instance, high-k oxides include hafnium oxide, lanthanum oxide, lanthanum aluminum oxide, zirconium oxide, tantalum oxide, titanium oxide, barium strontium titanium oxide, barium titanium oxide, strontium titanium oxide, yttrium oxide, aluminum oxide, and lead scandium tantalum oxide, to name some examples. In some embodiments, layer 222 need not include an oxide material. For instance, in some such embodiments, layer 222 may include other high-k dielectric material, such as hafnium silicate, zirconium silicate, tantalum silicate, aluminum silicate, silicon nitride, boron nitride, aluminum nitride, and lead zinc niobate, to name some examples. However, in embodiments where layer 222 includes an oxide material, the bond of the oxygen molecules in that layer 222 to the material of polarization charge inducing layer 220 (e.g., AlN) may make the interface between layers 220 and 222 vulnerable to subsequent wet etching, as will be described in more detail with reference to FIG. 2E below. In some embodiments, oxide layer 222 may have a thickness $T5$ of 0.1 to 100 nm (e.g., 1-4 nm), or any other suitable thickness, depending on the end use or target application. In some embodiments, layer 222 may have a multilayer structure including multiple oxide and/or high-k dielectric materials. For instance, in an example embodiment, oxide layer 222 may be formed using an atomic layer deposition (ALD) process, where the first layer on polarization charge inducing layer 220 is oxidized, and then aluminum and oxygen bonds are formed, followed by a layer of oxygen bonds, and so forth, alternating a layer of oxygen atoms and a layer of aluminum and oxygen atoms until a desired thickness for the layer is formed. In some embodiments, polarization charge inducing layer 220 may or may not include grading (e.g., increasing and/or decreasing) the content of one or more materials in at least a portion of the layer. In some embodiments, oxide layer 222 may have a thickness $T5$ of 0.1 to 100 nm (e.g., 1-10 nm), or any other suitable thickness, depending on the end use or target application.

In some embodiments, hardmask layer 224 may include any suitable materials, such as an oxide (e.g., silicon dioxide), nitride (e.g., silicon nitride), or carbide (e.g., silicon carbide) material, or a dielectric material, to name some examples. In some embodiments, hardmask layer 224 may be a sacrificial protective layer to be later removed and replaced with insulator material, for example, as will be described in more detail below. In some embodiments, hardmask layer 224 may have a multilayer structure including multiple hardmask materials. In some embodiments, hardmask layer 224 may include grading (e.g., increasing and/or decreasing) the content of one or more materials in at least a portion of the layer. In some embodiments, hardmask layer 224 may have a thickness $T6$ of 5 nm to 1 micron (e.g., 20 to 500 nm), or any other suitable thickness, depending on the end use or target application. In some embodiments, additional layers may be present in the stack shown in FIG. 2A. For example, in some such embodiments, a buffer layer (e.g., a III-N material buffer layer) may be present below III-N layer 210. For instance, in the case where III-N layer 210 is AlGaN, a GaN buffer layer may be located below AlGaN layer 210. Another example of an additional layer, in some embodiments, is an additional polarization charge inducing layer that may be located above or below polarization charge inducing layer 220, for instance. Such an additional polarization charge inducing layer may include any suitable III-V or III-N material, and it may be present to further increase carrier mobility in the transistor channel region and/or to improve compatibility (e.g., density of interface traps) between polarization charge inducing layer 220 and oxide layer 222, for example. Numerous material and layer configurations will be apparent in light of this disclosure.

Figure 2B:
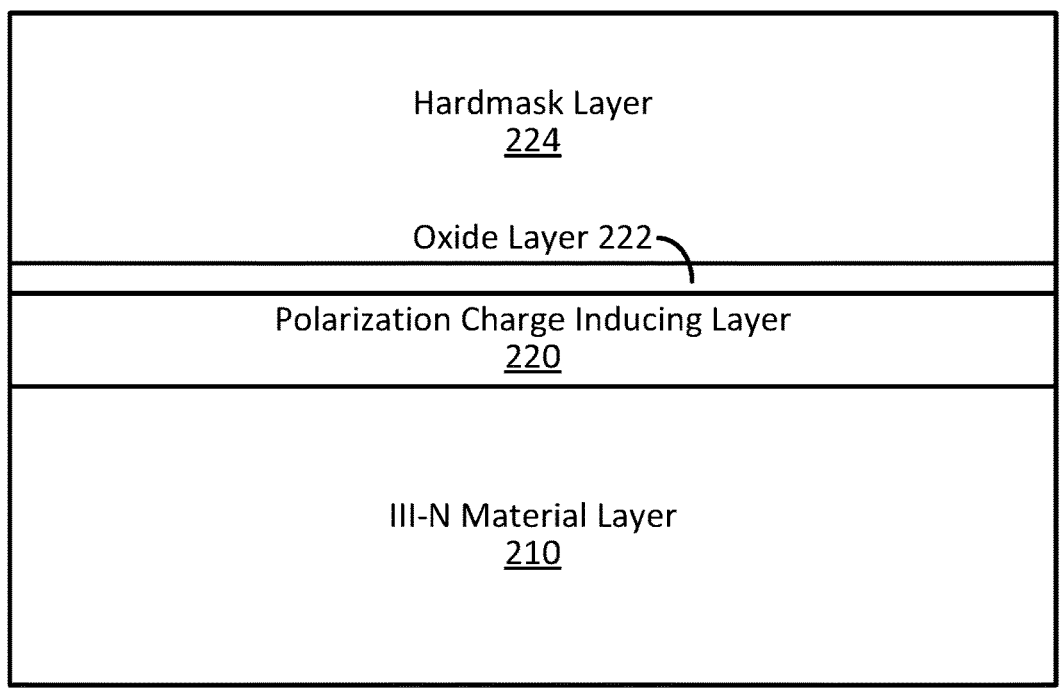
Figure 2C:
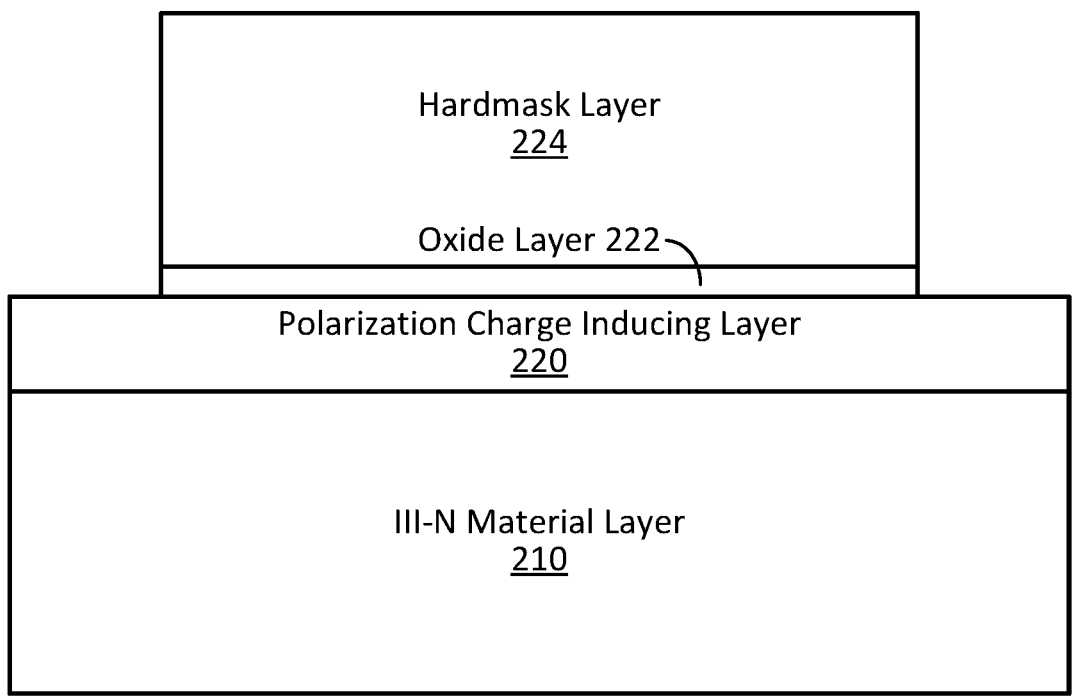
Figure 2D:
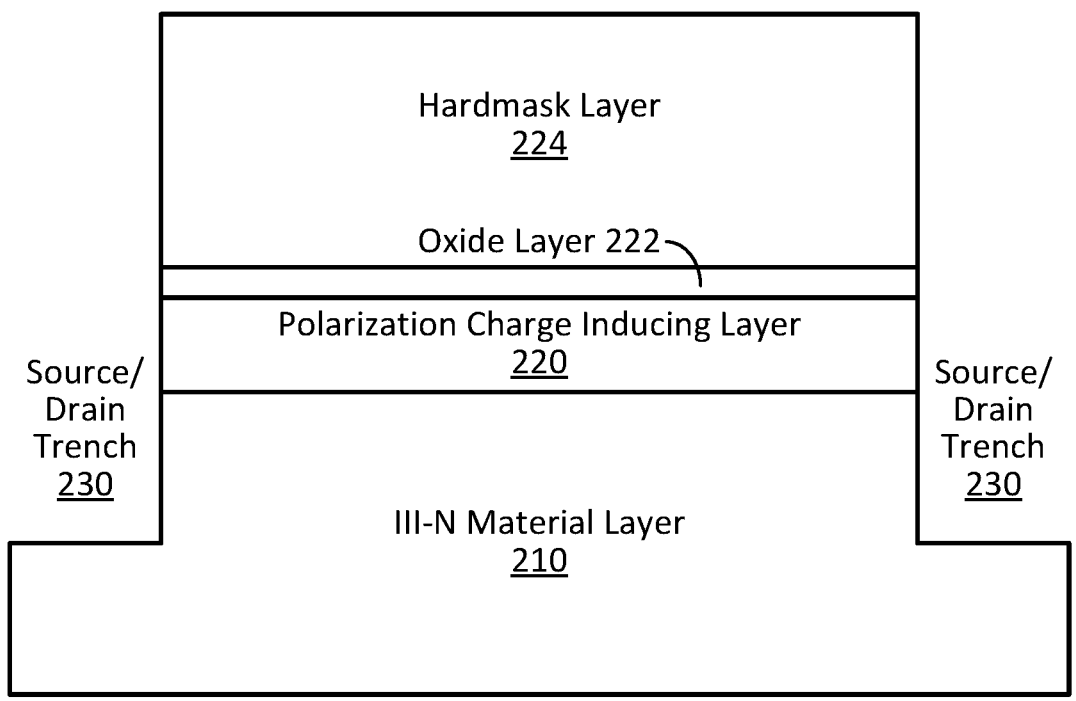

FIG. 2B illustrates the structure of FIG. 2A without optional layers 202 and 204, in accordance with an embodiment. Note that optional layers 202 and 204 are not shown in FIG. 2B (or in FIGS. 2C-G) for ease of illustration with respect to the techniques being described. However, in some embodiments, one or both of the optional layers 202 and 204 may be present in the structures, even though they are not shown. FIG. 2C illustrates an example structure after patterning has been performed on hardmask layer 224 and oxide layer 222 in the structure of FIG. 2B, in accordance with an embodiment. In such an embodiment, any suitable techniques can be used to pattern the two layers 224 and 222 to form the structure shown in FIG. 2C. FIG. 2D illustrates an example structure after etching has been performed to form source/drain (S/D) trenches 230 in the structure of FIG. 2C, in accordance with an embodiment. In such an embodiment, any suitable techniques can be used to form S/D trenches 230, such as one or more wet and/or dry etch processes that remove material from polarization charge inducing layer 220 and III-N layer 210 as shown, for example. In some such instances, the etch process(es) may be performed in-situ (without air break), for example.

Figure 2E:
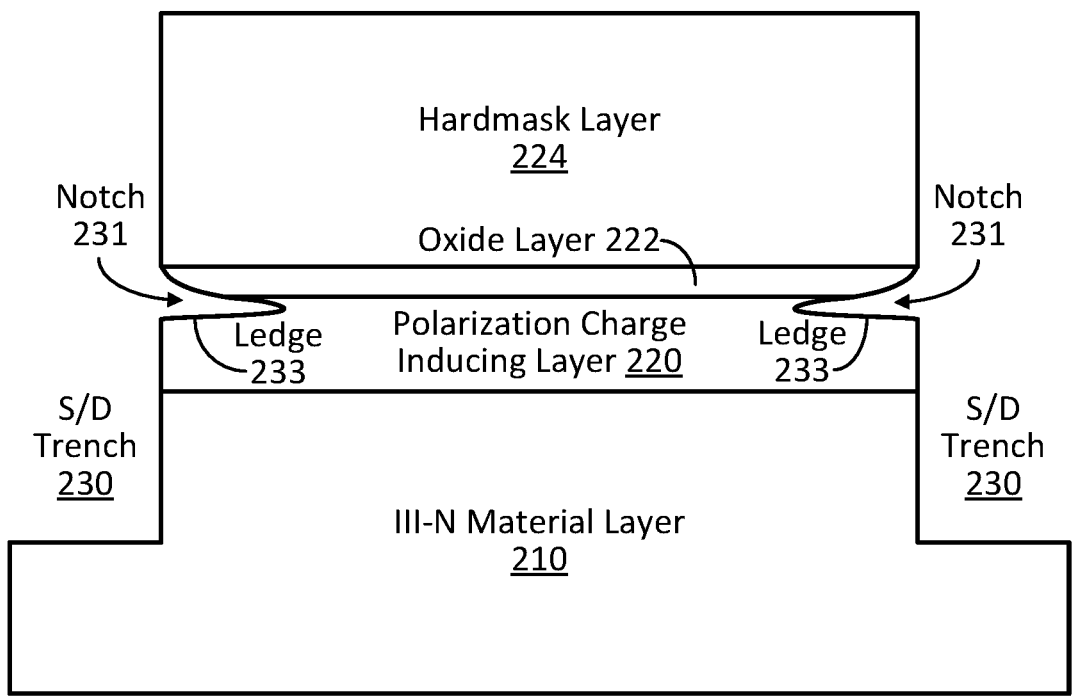

FIG. 2E illustrates an example structure after using a selective wet etch process to form notches 231 in the structure of FIG. 2D, in accordance with an embodiment. In such an embodiment, any suitable techniques may be used to form notches 231, such as using a wet etch process that selectively removes material from the interface between polarization charge inducing layer 220 and oxide layer 222, for example. Such a selective wet etch process may remove polarization charge inducing layer material 220 and/or oxide layer material 222 at the interface therebetween at a rate of at least 2, 3, 4, 5, 6, 7, 8, 9, 10, 15, 20, 25, 30, 40, or 50 times faster than the removal of other material or the removal of such material (material in layers 220 and 222) at other locations in the structure, or some other suitable selective removal rate, as will be apparent in light of this disclosure. For instance, in an example embodiment, the selective wet etch used to form notches 231 may include an etchant of tetramethylammonium hydroxide (TMAH) and a lateral (horizontal, at the sides of the structure shown) etch direction. In such an example embodiment, the oxidation of the top of polarization charge inducing layer 220 caused by the formation of oxide layer 222 thereon makes the interface therebetween vulnerable to wet etching using a TMAH-based etchant. As shown in FIG. 2E, the wet etch process may remove material laterally (in a horizontal direction) faster than it removes the thickness of the material (in a vertical direction) of the layers involved (layers 220 and 222) to form notches 231. In some embodiments, the shape of notches 231 may influence the shape of S/D arm portions 237 described herein, as S/D arm portions 237 are formed in notches 231, as will be apparent in light of this disclosure. Note that the selective wet etch used to form notches 231 also exposes a high-quality surface of polarization charge inducing layer material 220 from which S/D material can be grown, the high-quality surface shown as ledge 233. Also note that although the features indicated as 231 are primarily described herein as notches, in some embodiments, they may also be considered grooves, slits, cuts, or incisions, for example.

Figure 2F:
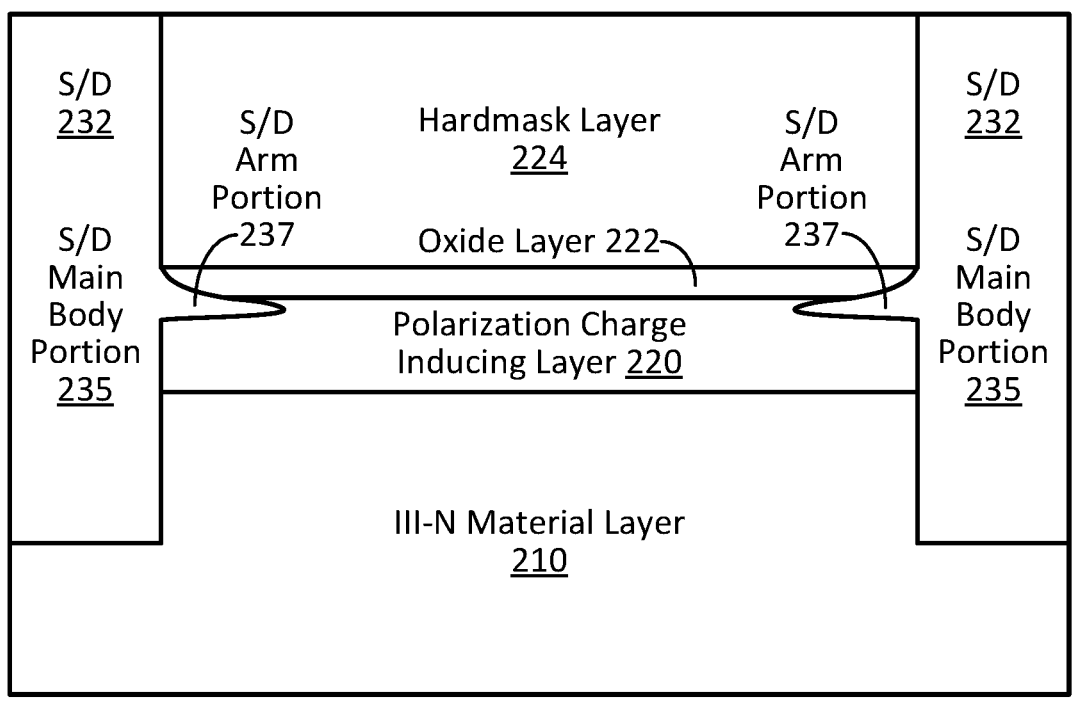

FIG. 2F illustrates an example structure after S/D material 232 has been grown in the notches 231 and S/D trenches 230 of the structure of FIG. 2E, in accordance with an embodiment. In some embodiments, S/D regions may be formed using any suitable techniques, including the deposition techniques described herein, such as growing or regrowing the S/D material 232 using an MOCVD process, for example. In some embodiments, the growth or regrowth of the S/D material 232 may occur on the structure of FIG. 2E simultaneously at the bottom of S/D trenches 230 and on polarization charge inducing layer 220 in notches 231 (and on ledges 233). In some embodiments, the ledges 233 of polarization charge inducing layer 220 exposed by the formation of notches 231 (e.g., exposed by performing the selective wet etch described above) may provide relatively high-quality surfaces from which to grow S/D material 232 and thus result in S/D material having relatively high-quality crystalline structure. In some instances, such high-quality polarization charge inducing layer 220 surfaces can be compared to the relatively lower quality growth surfaces in S/D trenches 230 that may have been formed using a dry etch process, for example. In such instances, the S/D material 232 may grow faster from ledges 233, than from the bottom of S/D trenches 230, such that at least a majority of the S/D material 232 is of the relatively high-quality crystalline structure grown from ledges 233. In some embodiments, S/D regions 232 may include any suitable materials, such as a III-V material, a III-N material, and/or any other suitable materials, depending on the end use or target application. In addition, in some embodiments, the S/D material 232 may be doped in an n-type or p-type manner, for example, using any suitable doping techniques. In an example embodiment, S/D regions 232 may include indium and nitrogen (e.g., InN or InGaN) and be doped in an n-type manner using Si with doping amounts of around 2E20 per cubic cm. In some embodiments, one or both of the S/D regions 232 may have a multilayer structure including multiple materials. In some embodiments, one or both of the S/D regions 232 may or may not include grading (e.g., increasing and/or decreasing) the content of one or more materials in at least a portion of the layer. As shown in the example structure of FIG. 2F, the S/D regions 232 each include a main body portion 235 and an arm portion 237, which will be described in more detail below with reference to FIGS. 2G and 3. Numerous S/D configurations will be apparent in light of the present disclosure.

Figure 2G:
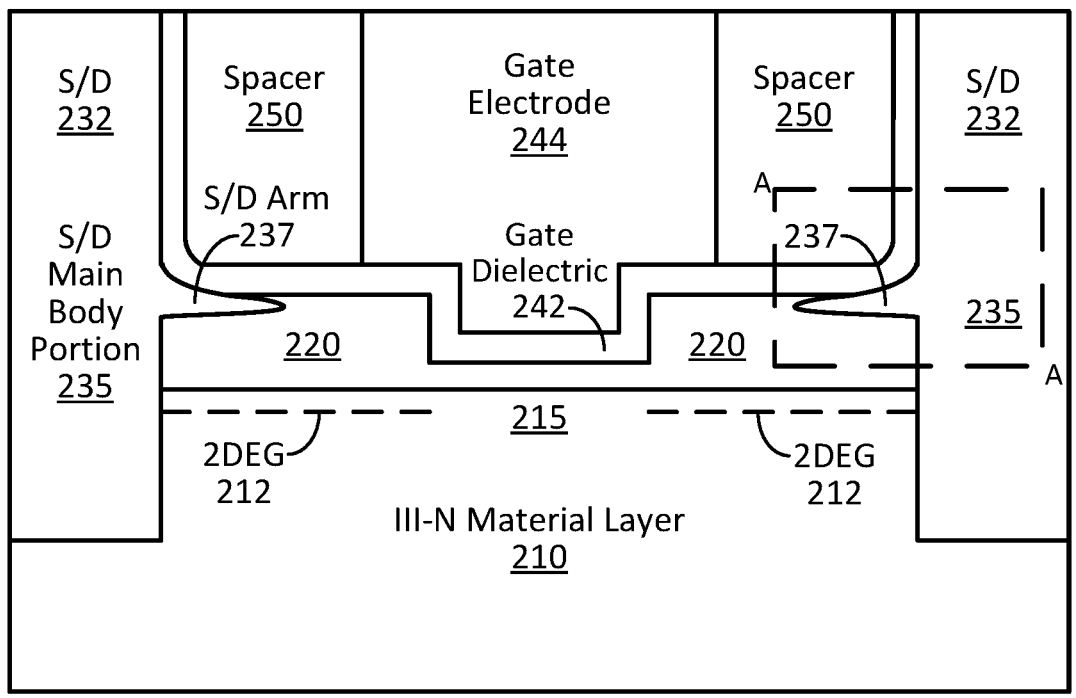

FIG. 2G illustrates an example structure after gate stack processing has been performed on the structure of FIG. 2F, in accordance with an embodiment. In this example embodiment, the gate stack processing included etching and removing hardmask layer 224 and oxide layer 222, etching a portion of the center of polarization charge inducing layer 220, depositing gate dielectric layer 242, depositing spacer material 250, etching the center of the spacer material 250 to form a trench for gate electrode 244, and depositing gate electrode material 244 to form the structure shown. Such processing may be achieved using any suitable techniques, such as any suitable wet and/or dry etch processes, any suitable deposition processes such as those described herein (e.g., MBE, CVD, PVD), any suitable planarization and/or polishing processes, and so forth. In some embodiments, at least a portion of oxide layer 222 may remain on the structure shown in FIG. 2G, and in some embodiments, oxide layer 222 may be used as gate dielectric layer 242, for example. Further, in some such embodiments, at least a portion of hardmask layer 224 may be used for spacer material 250. Therefore, in some embodiments, remnants of oxide layer 222 and/or hardmask layer 224 may remain in the end structure, whether desired or as a result of the real-world fabrication processes used. However, in this example embodiment, oxide layer 222 and hardmask layer 224 were removed and replaced with gate dielectric layer 242 and spacer layer 250. Also note that although gate dielectric layer 242 is shown as having been blanket deposited between S/D regions 232, and was thus conformally formed such that the material layer tracks the topography of the structure as shown, in some embodiments, gate dielectric layer 242 may only be present below gate electrode 244. In other words, in some embodiments, gate dielectric layer material 242 need not be present below or adjacent to spacer material 250, for example. In some such embodiments, as previously described, oxide layer material 222 may or may not remain below spacer material 250. In some embodiments, gate dielectric material 242 may also be located between gate electrode material 244 and spacer material 250. In some embodiments, gate dielectric layer material 242 may be located over at least a portion of the S/D regions 232, such as over portions of the region that do not have S/D contacts over the S/D regions, for example. In some such embodiments, such a structure may occur as a result of a blanket deposition of the gate dielectric material, for example. Numerous gate stack material configurations will be apparent in light of the present disclosure.

In some embodiments, spacer material 250 may include any suitable material, such as dielectric material, oxide material (e.g., silicon oxide) and/or nitride material (e.g., silicon nitride), depending on the end use or target application. As previously described, in some embodiments, hardmask material 224 may be used for spacer material 250, such that hardmask layer 224 is retained in the end structure. In some embodiments, gate dielectric material 242 may include silicon dioxide and/or high-k dielectric material, depending on the end use or target application. Example high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to name some examples. In some embodiments, an annealing process may be carried out on the gate dielectric layer 242 to improve its quality when a high-k material is used, for example. In some embodiments, the material of gate electrode 244 and/or gate contact (where present) may include any suitable material, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, one or more material layers may be formed between the gate dielectric 242 and gate electrode 244 to, for example, increase the interface quality between the gate dielectric 242 and the gate electrode 244 and/or to improve the electrical properties between the gate dielectric 242 and the gate electrode 244. Such intervening layers may include one or more work-function material layers, for example. In some embodiments, gate dielectric layer 242 and/or gate electrode 244 may include a multi-layer structure of two or more material layers. In some embodiments, gate dielectric layer 242 and/or gate electrode layer 244 may include grading (e.g., increasing and/or decreasing) the content of one or more materials in at least a portion of the layer(s).

Note that, in this example embodiment, transistor channel region 215 may be defined by the gate stack (including gate dielectric 242 and gate electrode 244), such that channel 215 is below the gate stack as shown. Also note that, in this example embodiment, polarization charge inducing layer 220 located above III-N material layer 210 forms a two-dimensional electron gas (2DEG) configuration 212 when the transistor is in an on state. As can be understood based on this disclosure, a 2DEG configuration includes a gas of carriers (e.g., electrons or holes) free to move in two dimensions but tightly confined in the third. Such a tight confinement can lead to quantized energy levels for motion in the third. Although 2DEG configurations include electron carriers and two-dimensional hole gas (2DHG) configurations include hole carriers, the term 2DEG will be used herein to generally refer to both carrier type configurations (both electron and hole carriers) for ease of description, unless otherwise stated. Therefore, in some instances, the 2DEG configuration 212 locations may be considered a part of the channel region, as the 2DEG configurations 212 (along with region 215) allow charge carriers (e.g., electrons or holes) to flow from the source to the drain when the transistor is in an on state.

Figure 3:
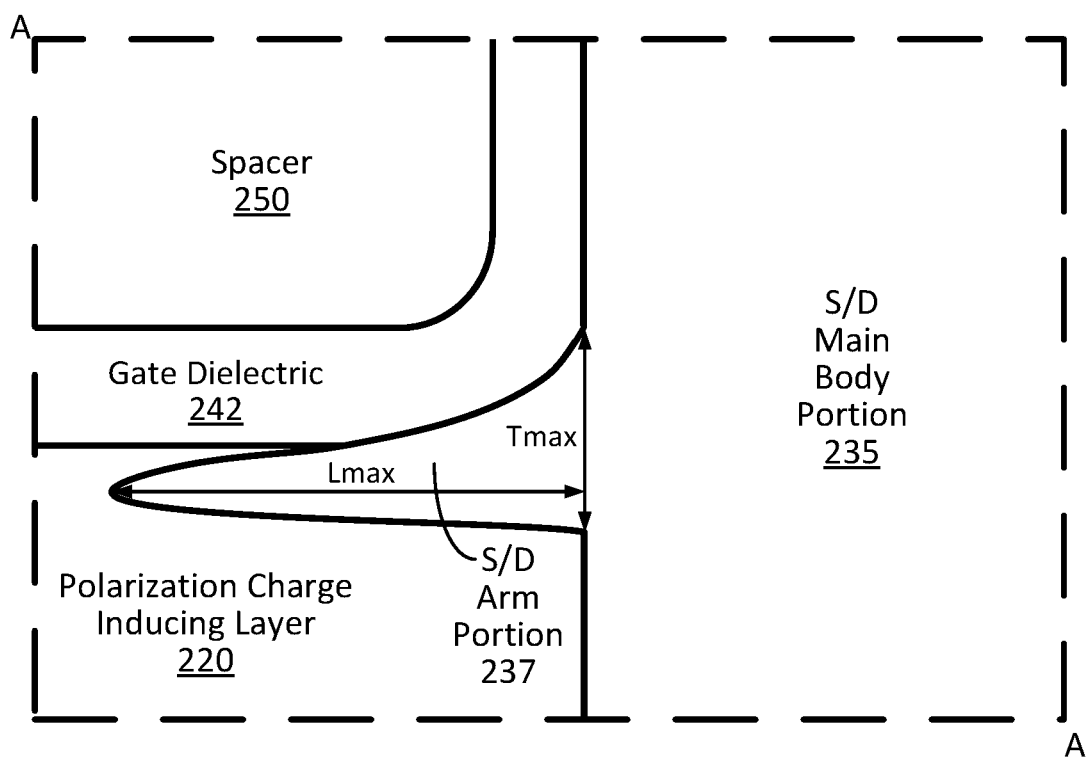
FIG. 3 illustrates a blown-out view of the A-A rectangle portion indicated in the structure of FIG. 2G, in accordance with some embodiments of this disclosure.

FIG. 3 illustrates a blown-out view of the A-A rectangle portion indicated in the structure of FIG. 2G, in accordance with some embodiments. FIG. 3 is provided to assist in the description of the S/D main body portion 235 and the S/D arm portion 237. As can be seen in FIG. 3, the S/D main body portion 235 is indicated with cross-hatch shading and the S/D arm portion 237 is indicated with diagonal shading, for ease of visual identification. As previously described, each S/D arm portion 237 is the portion of S/D material 232 that was formed in each notch 231 shown in the structure of FIG. 2E, and the remainder of the S/D region is the main body portion 235. Put another way, each S/D main body portion 235 is the entirety of the S/D region 232 that would have been formed had notches 231 not been formed (e.g., if the selective wet etch used to form FIG. 2E had been skipped). As can be understood based on this disclosure, the shape of each S/D arm portion 237 may be the same as or closely approximate the shape of each notch 231 formed as described herein. Thus, in some embodiments, to achieve a desired S/D arm 237 shape and/or size, the conditions related to the formation of notches 231 may be adjusted accordingly. As was also previously described, each S/D arm portion 237 extends laterally from each respective S/D main body portion 235 toward the other S/D region 232, which can be best seen in FIG. 2G. As the blown-out section shown in FIG. 3 relates to the right S/D arm portion 237, that arm portion extends leftward from the S/D main body portion 235 shown and toward the other S/D region (not depicted in FIG. 3, but shown in FIG. 2G). Note that although feature 237 is referred to herein as an arm or arm portion, it may also be considered a finger, branch, offshoot, protrusion, appendage, or sprout, for example. Also note that although feature 237 is shown as generally finger-shaped in this example embodiment, the present disclosure is not intended to be so limited. Further note that in some embodiments, at least a portion of the S/D arm may be considered located in polarization charge inducing layer material, such as is the case shown in the example structure of FIG. 3, where the distal end of S/D arm 237 (the end farthest from S/D main body portion 235) includes polarization charge inducing layer material 220 below and above it. In other words, in some embodiments, the S/D arm material may be at least one of on and in polarization charge inducing layer material.

As shown in FIG. 3, the maximum length Lmax and maximum thickness Tmax of the S/D arm portion 237 are indicated. As can be understood based on this disclosure, the length of the S/D arm 237 is a dimension in the direction of the main axis of extension from its respective S/D main body portion 235, which is the horizontal direction, in this example embodiment. As can also be understood, the thickness of the S/D arm 237 is a dimension in a direction perpendicular to the length of the S/D arm 237, which is in the vertical direction and is also the same direction as used for thicknesses T1-T6 in FIG. 2A, in this example embodiment. Note that in real world applications, the length dimension need not be exactly horizontal, particularly where a cross-sectional view used to detect S/D arm feature 237 is not perfectly aligned (compared to the perfect alignment shown in FIG. 3). In some embodiments, Lmax of an S/D arm portion 237 may be in the range of 5-500 nm (e.g., 10-100 nm), or any other suitable length, depending on the end use or target application. In some embodiments, Tmax of an S/D arm portion 237 may be in the range of 1-100 nm (e.g., 2-20 nm), or any other suitable thickness, depending on the end use or target application. In some embodiments, the ratio of Lmax to Tmax of an S/D arm portion 237 may be at least 0.5, 1, 1.5, 2, 2.5, 3, 3.5, 4, 4.5, 5, 6, 7, 8, 9, 10, 11, 12, 15, 20, 30, 40, or 50, or some other suitable minimum ratio, depending on the end use or target application. As can be seen in FIG. 3, S/D arm portion 237 tapers to a tip, such that the thickness of the feature decreases as the length away from the respective S/D main body portion 235 increases. However, the shape shown is provided for illustrative purposes and is not intended to limit the present disclosure. For example, although the shape of arm portion 237 shown in FIG. 3 tapers inward toward the tip from both the top and bottom of the feature 237 (when moving from right to left), in some embodiments, tapering may only occur on one side or one side may taper outward for at least some length of the feature, to name some example variations that may occur. Note that although S/D arm portions 237 are shown below gate dielectric material 242 in this example embodiment, and more specifically in this example case, gate dielectric material 242 is on S/D arm portions 237, in some embodiments, that need not be the case. For example, in some such embodiments, the gate dielectric material 242 may only be formed above channel region 215. In some embodiments, S/D arm portions 237 may be directly below spacer material 250 and/or at least some oxide layer material 222 may remain on S/D arm portions 237, for example. Some example variations that may occur with respect to S/D arm portions 237 will be described with reference to FIG. 5.

In some embodiments, additional processing may be performed to complete the formation of a transistor. For example, the processing may include depositing insulator and/or dielectric material over the structure shown in FIG. 2G and then forming S/D contacts using a standard or custom S/D contact formation process flow. In one example case, after forming contact trenches in the insulator material and over S/D regions 132, a contact structure is provided therein. In some embodiments, such S/D contacts may include any suitable material, such as a conductive metal or alloy (e.g., aluminum, tungsten, silver, nickel-platinum, or nickel-aluminum). In some embodiments, S/D contacts may include a resistance reducing metal and a contact plug metal, or just a contact plug, depending on the end use or target application. Example contact resistance reducing metals include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the S/D contact region, such as adhesion layers (e.g., titanium nitride) and/or liner or barrier layers (e.g., tantalum nitride), if so desired. Note that, in some embodiment, gate stack processing (including forming gate dielectric 242 and gate electrode 244) may be performed prior to the formation of S/D contacts, while in other embodiments, gate stack processing may be performed after the formation of S/D contacts, for example. Additional processing may be performed to complete the formation of one or more transistor devices, such as performing back-end-of line interconnections, for example.

Figure 4:
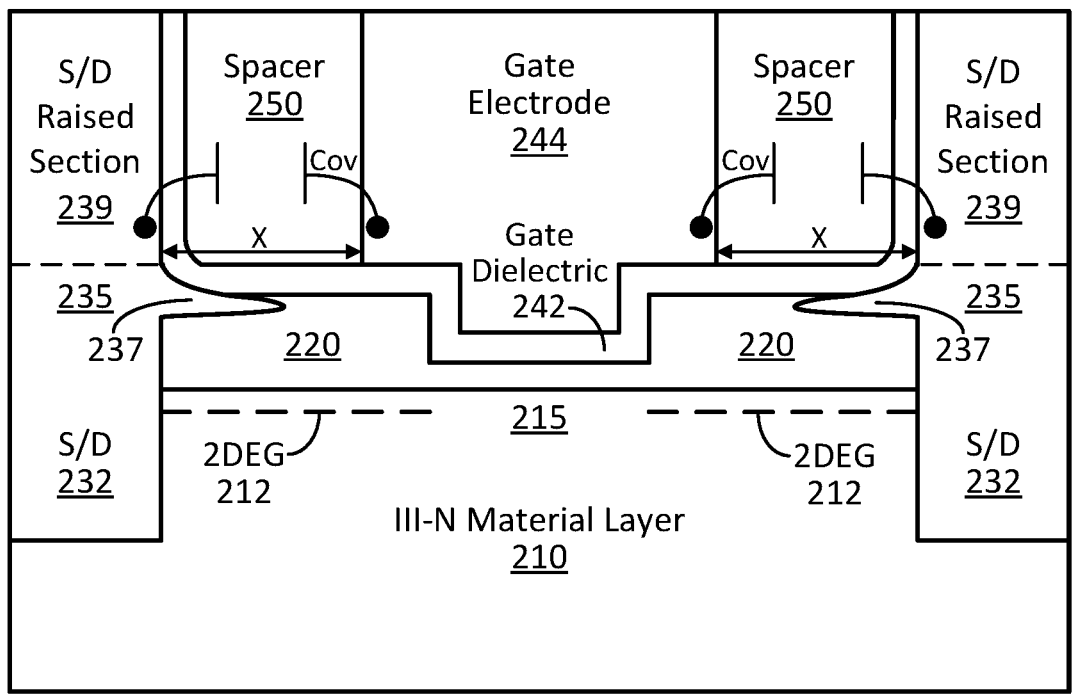
FIG. 4 illustrates the structure of FIG. 2G, showing the reduction in parasitic overlap capacitance (Cov) compared to the structure of FIG. 1, as a result of the relatively retracted raised source/drain (S/D) sections, in accordance with an embodiment of this disclosure.

FIG. 4 illustrates the structure of FIG. 2G, showing the reduction in overlap capacitance (Cov) compared to the structure of FIG. 1, as a result of the relatively retracted raised source/drain (S/D) sections, in accordance with an embodiment. The raised sections 239 of the S/D regions 232, in this example embodiment, include the thickness of the S/D regions 232 that is adjacent to spacer material 250, which is shown above the dotted line in FIG. 4 to help visualize the S/D raised sections 239. In other words, the spacer material 250 is between the raised S/D sections 239 and the gate electrode 244, in this example embodiment. In some embodiments, the material of the raised S/D sections may be native to the rest of the corresponding S/D region material, while in some embodiments, the material of the raised S/D sections may be different than the rest of the corresponding S/D region material. For instance, in some embodiments, it may be beneficial to form the raised S/D sections using material that assists with making contact to the S/D regions, for example. As can be understood based on this disclosure, the techniques described herein result in a relative increase in the separation distance X between at least a portion of each S/D raised section 239 and the gate electrode material 244, compared to the structure of FIG. 1, thereby resulting in a reduced (or in some cases, eliminated) parasitic Cov. In other words, the techniques described herein result in the raised sections 239 of the S/D regions 232 being pulled back away from the gate electrode material 244, such that for a given configuration and with all other features of the structure being the same (as is the case with the structures of FIGS. 1 and 4), the Cov can be reduced without sacrificing the benefits derived from growing (or regrowing) the S/D material 232 on high-quality ledges of the polarization charge inducing layer 220 material. Note that in this example embodiment, the raised sections 239 of S/D regions 232 are a part of the thickness of the S/D main body portions 235 and that the S/D arm portions 237 are not a part of the S/D raised sections 239. Also note that although parasitic Cov is shown in the example structure of FIG. 4, and even though such parasitic Cov is greatly reduced compared to the parasitic Cov present in the example structure of FIG. 1, in some embodiments, the techniques described herein may result in the elimination of parasitic Cov or the reduction of parasitic Cov to an amount that has a negligible or unmeasurable impact on transistor performance, for example.

Figure 5:
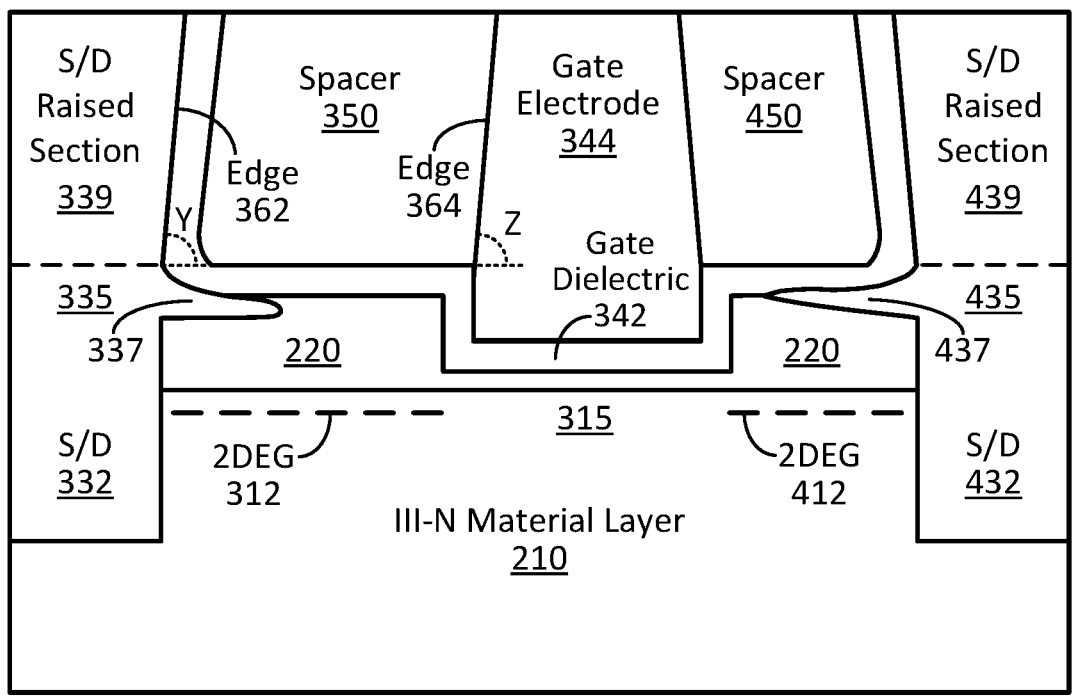
FIG. 5 illustrates an example transistor structure similar to the structure of FIG. 4, showing multiple structural variations that may occur, in accordance with some embodiments of this disclosure.

FIG. 5 illustrates an example transistor structure similar to the structure of FIG. 4, showing multiple structural variations that may occur, in accordance with some embodiments. Note that all of the feature identification numbers are similar to those in FIG. 4, except that the first digit of those numbers may have been changed from a 2 to a 3 or 4 to assist in referring to the different features. For example, III-N material layer 210 and polarization charge inducing layer 220 are still referred to as such; however, the S/D regions have been renumbered from 232 to 332 and 432 as shown, the respective S/D region components have also been similarly renumbered, the gate dielectric and gate electrode have been renumbered from 242 and 244 to 342 and 344, respectively, and so forth. Therefore, the previous relevant discussion with respect to the similar features is applicable to the structure of FIG. 5. As can be seen in FIG. 5, multiple structural changes relative to the structure of FIG. 4 have occurred. One of the changes is that the shapes of the S/D arm portions 337 and 437 are different relative to S/D arm portions 237, to illustrate example variations that may occur. As shown, S/D arm portion 337 includes a lower surface that is relatively flat and that does not taper as compared to S/D arm portions 237 and 437. In addition, S/D arm portion 337 has a more rounded (or substantially U-shaped) tip or end as compared to S/D arm portions 237 and 437 which have more pointed (or substantially V-shaped) tips or ends. As can also be seen, the tip or end of S/D arm portion 437 ends at a higher location (e.g., a location closer to the spacer material) as compared to S/D arm portions 237 and 337. In addition, S/D arm portion 437 has a greater Lmax and thus laterally extends farther away from its S/D main body portion 435 as compared to S/D arm portions 237 and 337. In some embodiments, S/D arm portions on either side of a transistor structure may be substantially symmetrical (e.g., as is the case in FIG. 4) or asymmetrical (e.g., as is the case in FIG. 5). In some embodiments, one or more voids may be created in and/or around S/D arm portion material, where such voids may be formed as a result of the S/D material not being able to completely fill the notches when the S/D material is grown (or regrown) therein. Numerous S/D arm portion variations and configurations will be apparent in light of this disclosure.

Another variation that the example structure of FIG. 5 illustrates is that the gate stack shape and location has changed. For example, the base of gate electrode 344 is relatively wider than the base of gate electrode 244, and thus, gate dielectric material layer 342 has a different shape than gate dielectric material layer 242. Further, an upper portion of gate electrode 344 is narrower than the upper portion of gate electrode 244, and gate electrode 344 also tapers inward when going up the feature, as can be seen. In addition, as shown in FIG. 5, the gate stack (including gate electrode 344 and gate dielectric 342) is closer to S/D region 432 than S/D region 332. Thus, in some embodiments, the gate stack may be the same distance from both of the source and drain regions (e.g., as is the case in FIG. 4) or the gate stack may be closer to one of the S/D regions than the other S/D region, depending on the end use or target application. For example, in some embodiments, the gate stack may be at least 5, 10, 15, 20, 25, 50, 75, or 100 nm closer to one of the S/D regions than the other S/D region, or some other suitable minimum amount closer, depending on the end use or target application. Note that the shift in the gate stack also affected the lengths of the 2DEG configurations, as the length of 2DEG configuration 312 on the left side increased and the length of the 2DEG configuration 412 on the right side decreased as shown. Also note that in this example structure, as well as the example structure of FIG. 4, the distal end of the arm portions are closer to the gate electrode material than the material of the S/D raised sections. Numerous gate stack variations will be apparent in light of this disclosure.

Another variation that the example structure of FIG. 5 illustrates is that the S/D raised sections 339 and 439 slope inward toward the center of the transistor when going up the sections. As can also be seen, edges 362 and 364 are identified in FIG. 5. Edge 362 is the edge of S/D raised section 339 that is closest to the gate electrode 344 and edge 364 is the edge of gate electrode 344 that is closes to S/D raised section 339. The angles of inclination are also indicated, where edge 362 has an angle of inclination Y and edge 364 has an angle of inclination Z. In this example embodiment, edges 362 and 364 are exactly parallel, such that the angles of inclination Y and Z are equal, with both being approximately 85°. In the example embodiment of FIG. 4, the angles of inclination of the edges at issue are also both exactly parallel, with both edges having an angle of inclination of 90°. In some embodiments, within a transistor structure, an edge of an S/D raised section closest to the gate electrode material may be substantially parallel to an edge of the gate electrode material closest to the respective S/D raised section, such that the angles of inclination of the S/D raised section edge and the corresponding closest gate electrode edge are within 1, 2, 3, 4, 5, 6, 7, 8, 9, 10, 11, 12, 13, 14, or 15 degrees of each other, or some other suitable maximum degree amount, depending on the end use or target application. In other words, in the example structure of FIG. 5, edges 362 and 364 may be substantially parallel, such that Y and Z are within 1, 2, 3, 4, 5, 6, 7, 8, 9, 10, 11, 12, 13, 14, or 15 degrees of each other, or some other suitable maximum degree amount, depending on the end use or target application. Note that in some embodiments, such edges (e.g., edges 362 and 364) may be substantially parallel as a result of the techniques used to retract or pull away S/D raised sections, as described herein. For example, the angle of inclination of the edges of gate electrode 144 in FIG. 1 are 90 degrees, each, and the S/D raised section edges closest to the gate electrode material are approximately 106° (left S/D region) and approximately 74° (right S/D region), such that the difference between the angles of inclination of the respective pairs of edges is approximately 16°. Also note that the angles of inclination for the edges should both be measured from the same reference line, such as a horizontal line or a line created by an interface between two material layers, for example. In the example case of FIG. 5, the reference line is a horizontal line, and the angles of inclination Y and Z are measured from the right side of that horizontal line (e.g., the positive x-axis). Further note that in some cases, the S/D raised section edges (e.g., edge 362) and/or the gate electrode material edges (e.g., edge 364) may not be perfectly straight and thus they may not make a perfect line. However, in such cases, a line of best fit or a trend line can be used to approximate the edges, for example, and such trend lines can be used to compare the edges to determine, for instance, whether they are substantially parallel.

Although the techniques described with reference to FIGS. 2A-G and 3-5 primarily relate to forming a transistor having a planar configuration, the techniques can be applied to form transistors of varying configurations. For example, in some embodiments, the techniques may be used to form transistors having non-planar configurations, such as a dual-gate configuration, a tri-gate configuration, or a gate-all-around (GAA) configuration (e.g., including one or more nanowires or nanoribbons). Further, the techniques can be applied to benefit various different transistor types, such as metal-oxide-semiconductor field-effect transistors (MOSFETs), junction FETs (JFETs), tunnel FETs (TFETs), and high electron mobility transistors (HEMTs), to name a few examples. Further still, the techniques can be applied regardless of the transistor doping schemes used. For example, in the case of a MOSFET configuration, the channel region may be doped in a type opposite from the adjacent S/D regions, such as an n-type MOSFET (NMOS) configuration that includes n-type doped S/D material and p-type doped channel material, or a p-type MOSFET (PMOS) configuration that includes p-type doped S/D material and n-type doped channel material. In the case of a TFET configuration, the S/D regions may be oppositely typed doped (where one is n-type doped and the other is p-type doped) and the channel material may be minimally doped or undoped/intrinsic. Further note that the techniques can be used to benefit one or both of the n-type and p-type transistors included in a complementary device, such as one or both of the NMOS and PMOS transistors included in a complementary MOS (CMOS) device, for example. Also note that although the techniques in this disclosure are described and shown as being performed to both of the S/D regions of a transistor structure, in some embodiments, the techniques may be performed for only one of the S/D regions, such that only one of the source and drain regions includes an arm portion as described herein, for example. Accordingly, the techniques described herein are not intended to be limited to any particular transistor configuration, unless otherwise stated. Numerous variations and configurations will be apparent in light of the present disclosure.

Example System

Figure 6:
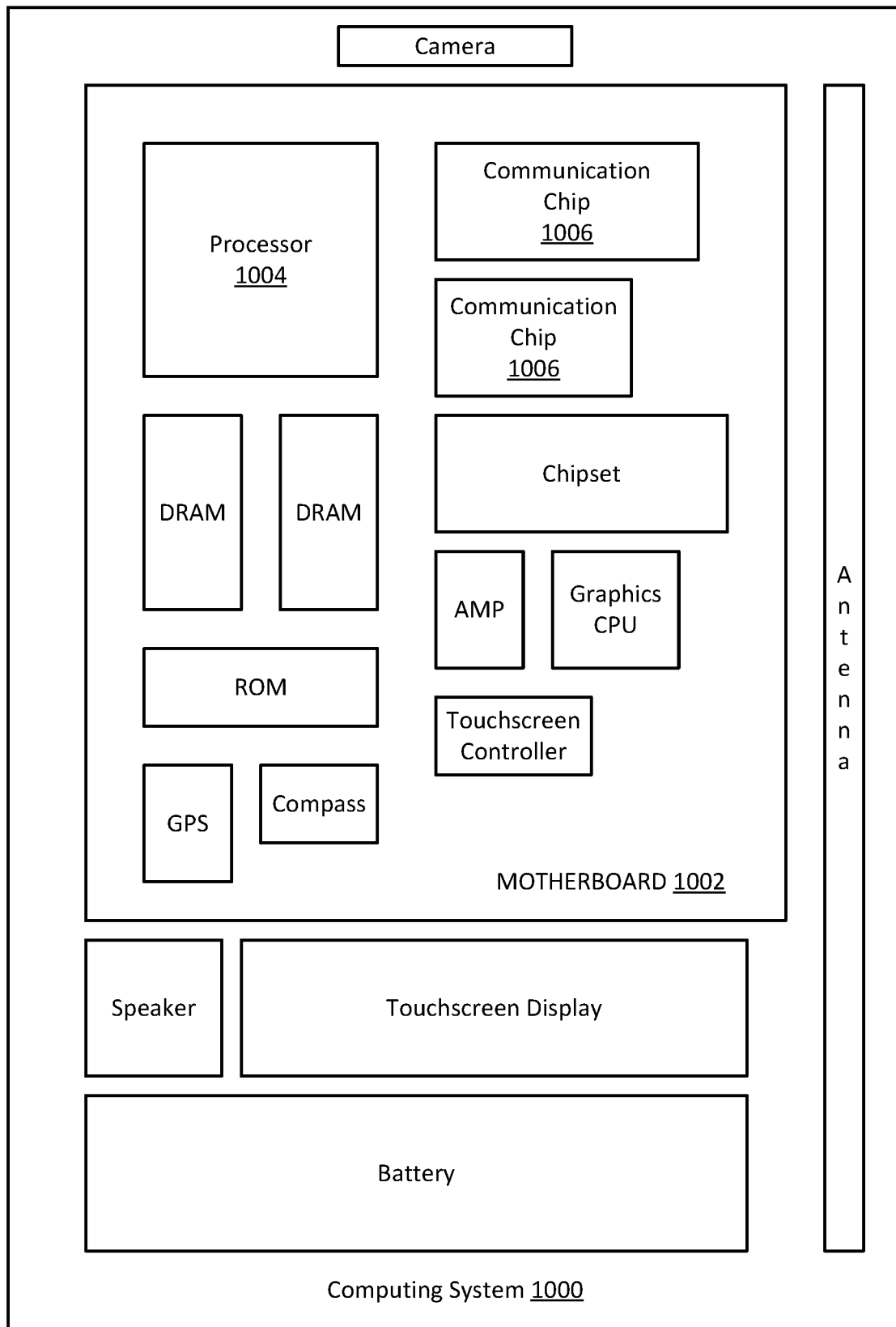
FIG. 6 illustrates a computing system implemented with integrated circuit structures or transistor devices formed using the techniques disclosed herein, in accordance with an embodiment of this disclosure.

FIG. 6 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more transistors including retracted raised source/drain regions, as described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is a transistor including: a first layer including III-N semiconductor material, the first layer including a channel region; a polarization charge inducing layer above the first layer; a gate stack above at least a portion of the channel region, the gate stack including gate dielectric material and gate electrode material; and source and drain (S/D) regions adjacent to the channel region, each S/D region including a main body portion and an arm portion, each S/D arm portion at least one of on and in the polarization charge inducing layer material and extending toward the other S/D region in a first direction; wherein each S/D arm has a maximum length in the first direction and a maximum thickness in a second direction perpendicular to the first direction, such that the ratio of the maximum length to the maximum thickness of each S/D arm is at least 2.

Example 2 includes the subject matter of Example 1, wherein the first layer includes gallium and nitrogen.

Example 3 includes the subject matter of any of Examples 1-2, wherein the polarization charge inducing layer includes aluminum and nitrogen.

Example 4 includes the subject matter of any of Examples 1-3, wherein the S/D regions include indium and nitrogen.

Example 5 includes the subject matter of any of Examples 1-4, wherein material of the S/D regions is n-type doped.

Example 6 includes the subject matter of any of Examples 1-5, wherein the polarization charge inducing layer and the first layer form a two-dimensional electron gas (2DEG) configuration when the transistor is in an on state.

Example 7 includes the subject matter of any of Examples 1-6, wherein the ratio of the maximum length to the maximum thickness of each S/D arm is at least 5.

Example 8 includes the subject matter of any of Examples 1-7, further including dielectric spacer material between each of the S/D regions and the gate electrode material, wherein each S/D main body portion includes a raised section adjacent to the dielectric spacer material, and wherein each S/D raised section is farther from the gate electrode material than a distal end of its respective S/D arm portion.

Example 9 includes the subject matter of any of Examples 1-8, further including dielectric spacer material between each of the S/D regions and the gate electrode material the gate electrode material, wherein each S/D main body portion includes a raised section adjacent to the dielectric spacer material, and wherein an edge of each S/D raised section closest to the gate electrode material is substantially parallel to an edge of the gate electrode material closest to the respective S/D raised section, such that angles of inclination of the S/D raised section edge and the corresponding closest gate electrode edge are within 5 degrees of each other.

Example 10 includes the subject matter of any of Examples 1-9, wherein the gate stack is at least 20 nm closer to one of the S/D regions than the other S/D region.

Example 11 includes the subject matter of any of Examples 1-10, wherein the transistor has a planar configuration.

Example 12 includes the subject matter of any of Examples 1-10, wherein the transistor has a non-planar configuration.

Example 13 includes the subject matter of any of Examples 1-12, wherein the transistor is a metal-oxide-semiconductor field-effect transistor (MOSFET).

Example 14 is a high-frequency amplifier device including the subject matter of any of Examples 1-13.

Example 15 is a computing system including the subject matter of any of Examples 1-14.

Example 16 is a transistor including: a first layer including III-N semiconductor material, the first layer including a channel region; a polarization charge inducing layer above the first layer; a gate stack above at least a portion of the channel region, the gate stack including gate dielectric material and gate electrode material; source and drain (S/D) regions adjacent to the channel region, each S/D region including a raised section; and dielectric spacer material between the gate electrode material and the raised section of each S/D region; wherein an edge of each S/D raised section closest to the gate electrode material is substantially parallel to an edge of the gate electrode material closest to the respective S/D raised section, such that angles of inclination of the S/D raised section edge and the corresponding closest gate electrode edge are within 10 degrees of each other.

Example 17 includes the subject matter of Example 16, wherein the first layer includes gallium and nitrogen.

Example 18 includes the subject matter of any of Examples 16-17, wherein the polarization charge inducing layer includes aluminum and nitrogen.

Example 19 includes the subject matter of any of Examples 16-18, wherein the S/D regions include indium and nitrogen.

Example 20 includes the subject matter of any of Examples 16-19, wherein material of the S/D regions is n-type doped.

Example 21 includes the subject matter of any of Examples 16-20, wherein the polarization charge inducing layer and the first layer form a two-dimensional electron gas (2DEG) configuration when the transistor is in an on state.

Example 22 includes the subject matter of any of Examples 16-21, wherein the angles of inclination of the S/D raised section edge and the corresponding closest gate electrode edge are within 5 degrees of each other.

Example 23 includes the subject matter of any of Examples 16-22, wherein each S/D region includes a main body portion and an arm portion, each S/D arm portion being below the dielectric spacer material and extending toward the other S/D region in a first direction, and wherein each S/D arm has a maximum length in the first direction and a maximum thickness in a second direction perpendicular to the first direction, such that the ratio of the maximum length to the maximum thickness of each S/D arm is at least 2.

Example 24 includes the subject matter of any of Examples 16-23, wherein each S/D region includes a main body portion and an arm portion, each S/D arm portion at least one of on and in the polarization charge inducing layer material and extending toward the other S/D region in a first direction, and wherein each S/D raised section is farther from the gate electrode material than a distal end of its respective S/D arm portion.

Example 25 includes the subject matter of any of Examples 16-24, wherein the gate stack is at least 20 nm closer to one of the S/D regions than the other S/D region.

Example 26 includes the subject matter of any of Examples 16-25, wherein the transistor has a planar configuration.

Example 27 includes the subject matter of any of Examples 16-25, wherein the transistor has a non-planar configuration.

Example 28 includes the subject matter of any of Examples 16-27, wherein the transistor is a metal-oxide-semiconductor field-effect transistor (MOSFET).

Example 29 is a high-frequency amplifier device including the subject matter of any of Examples 16-28.

Example 30 is a computing system including the subject matter of any of Examples 16-29. Example 31 is a method of forming a transistor, the method including: forming a polarization charge inducing layer on a first layer, the first layer including III-N semiconductor material; forming a second layer on the polarization charge inducing layer, the second layer including oxide material; forming source and drain (S/D) trenches in the polarization charge inducing layer and first layer; performing an etch in both of the S/D trenches to selectively remove material at an interface between the polarization charge inducing layer and the second layer, thereby adding a notch to each of the S/D trenches; forming S/D material in the S/D trenches and notches; and forming a gate stack above at least a portion of the first layer, the gate stack including gate dielectric material and gate electrode material.

Example 32 includes the subject matter of Example 31, wherein the first layer includes gallium and nitrogen.

Example 33 includes the subject matter of any of Examples 31-32, wherein the polarization charge inducing layer includes aluminum and nitrogen.

Example 34 includes the subject matter of any of Examples 31-33, wherein the S/D material includes indium and nitrogen.

Example 35 includes the subject matter of any of Examples 31-34, wherein the S/D material is n-type doped.

Example 36 includes the subject matter of any of Examples 31-35, wherein the polarization charge inducing layer and the first layer form a two-dimensional electron gas (2DEG) configuration when the transistor is in an on state.

Example 37 includes the subject matter of any of Examples 31-36, wherein the S/D material in each notch has a maximum length in a first direction and a maximum thickness in a second direction perpendicular to the first direction, such that the ratio of the maximum length to the maximum thickness of the S/D material in each notch is at least 2.

Example 38 includes the subject matter of any of Examples 31-37, wherein the second layer includes aluminum oxide.

Example 39 includes the subject matter of any of Examples 31-38, wherein the selective etch is a wet etch that includes a tetramethylammonium hydroxide (TMAH)-based etchant.

Example 40 includes the subject matter of any of Examples 31-39, wherein the selective etch selectively removes material at the interface between the polarization charge inducing layer and the second layer at a rate of at least 5 times faster than a rate of removal of material elsewhere.

Example 41 includes the subject matter of any of Examples 31-40, wherein forming the S/D material includes growing the S/D material on a bottom surface of the notches.

Example 42 includes the subject matter of any of Examples 31-41, further including forming dielectric spacers adjacent to at least a portion of both sides of the gate electrode material.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a first layer including a first semiconductor material, the first semiconductor material including nitrogen and one or more of gallium, indium, or aluminum;
   a second layer above the first layer, the second layer including a second semiconductor material, the second semiconductor material including nitrogen and one or more of gallium, indium, or aluminum;
   a gate structure above at least a portion of the second layer, the gate structure including a gate dielectric and a gate electrode; and
   a source region and a drain region, at least a portion of the first layer between the source and drain regions, the source region including (i) main body portion and (ii) an arm portion extending from the main body portion toward the drain region in a first direction, the drain region including (i) main body portion and (ii) an arm portion extending from the main body portion toward the source region in a second direction;
   wherein, for the arm portion of the source region, the ratio of a maximum length in the first direction to a maximum thickness is at least 2, and wherein, for the arm portion of the drain region, the ratio of a maximum length in the second direction to a maximum thickness is at least 2.

2. The integrated circuit of claim 1, wherein the first semiconductor material includes gallium and the second semiconductor material includes aluminum.

3. The integrated circuit of claim 1, wherein the source and drain regions include indium and nitrogen, wherein material of the source and drain regions is n-type doped, and wherein the second layer and the first layer are configured to form a two-dimensional electron gas (2DEG) configuration.

4. The integrated circuit of claim 1, wherein the ratio of the maximum length to the maximum thickness for the arm portion of the source region is at least 5, and the ratio of the maximum length to the maximum thickness for the arm portion of the drain region is at least 5.

5. The integrated circuit of claim 1, further comprising insulator material between the source region and the gate electrode, the insulator material also between the drain region and the gate electrode, wherein each of the main body portions of the source and drain regions includes a raised section adjacent to the insulator material, and wherein each of the raised sections is farther from the gate electrode material than a distal end of its respective arm portion.

6. The integrated circuit of claim 1, further comprising insulator material between the source region and the gate electrode, the insulator material also between the drain region and the gate electrode, wherein each of the main body portions of the source and drain regions includes a raised section adjacent to the insulator material, and wherein an edge of each of the raised sections closest to the gate electrode is substantially parallel to an edge of the gate electrode closest to the respective raised section, such that angles of inclination of the raised section edge and the corresponding closest gate electrode edge are within 5 degrees of each other.

7. The integrated circuit of claim 1, wherein the gate structure is at least 20 nanometers closer to one of the source or drain regions than the other of the source or drain regions, and wherein the gate structure is above the first layer.

8. The integrated circuit of claim 1, wherein at least a portion of the first layer is a fin that is between portions of the gate structure.

9. The integrated circuit of claim 1, wherein the gate structure wraps around at least a portion of the first layer.

10. A high-frequency amplifier device comprising the integrated circuit of claim 1.

11. A computing system comprising the integrated circuit of claim 1.

12. An integrated circuit, comprising:
a first layer including a first semiconductor material, the first semiconductor material including gallium and nitrogen;
a second layer above the first layer, the second layer including a second semiconductor material, the second semiconductor material including aluminum and nitrogen;
a gate structure above at least a portion of the second layer, the gate structure including a gate dielectric and a gate electrode, the gate dielectric at least between the second layer and the gate electrode;
a source region and a drain region, at least a portion of the first layer between the source and drain regions, the source and drain regions extending above a bottom portion of the gate dielectric; and
a first spacer between the source region and the gate electrode, the first spacer including one or more dielectric materials;
a second spacer between the drain region and the gate electrode, the second spacer including one or more dielectric materials;
wherein an edge of the source region closest to the gate electrode is substantially parallel to an edge of the gate electrode closest to the source region, such that angles of inclination of the source region edge and the corresponding closest gate electrode edge are within 10 degrees of each other.

13. The integrated circuit of claim 12, wherein the source and drain regions each include a main body portion and an arm portion, each arm portion extending toward the other arm portion, and each arm portion in contact with the gate dielectric and the second layer.

14. The integrated circuit of claim 13, wherein each arm portion includes a maximum length and a maximum thickness, each maximum length being at least double the respective maximum thickness.

15. A high-frequency amplifier device comprising the integrated circuit of claim 12.

16. A computing system comprising the integrated circuit of claim 12.

17. The integrated circuit of claim 1, wherein:
the arm portion of the source region has (i) a first end attached to the main body portion of the source region, and (ii) a second end opposite the first end; and
the second end of the arm portion of the source region is underneath the gate dielectric, and not underneath the gate electrode.

18. The integrated circuit of claim 1, further comprising:
insulator material between the source region and the gate electrode,
wherein at least a portion of the arm portion of the source region is underneath the insulator material, and separated from the insulator material by the gate dielectric.

19. The integrated circuit of claim 1, wherein:
the arm portion of the source region has (i) a first end attached to the main body portion of the source region, and (ii) a second end opposite the first end;
the first end is in contact with the gate dielectric; and
the second end is separated from the gate dielectric by the second layer.

20. An integrated circuit, comprising:
a first layer including a first semiconductor material, the first semiconductor material including nitrogen and one or more of gallium, indium, or aluminum;
a second layer compositionally different from and above the first layer, the second layer including a second semiconductor material, the second semiconductor material including nitrogen and one or more of gallium, indium, or aluminum;
a gate structure above at least a portion of the second layer, the gate structure including a gate dielectric and a gate electrode; and
a source region and a drain region, at least one of the source region or drain region including (i) a main body portion and (ii) an arm portion extending from the main body portion toward the gate structure,
wherein the arm portion has (i) a first end attached to the main body portion, and (ii) a second end opposite the first end,
wherein the first end is in contact with the gate dielectric, and
wherein the second end of the source region is separated from the gate dielectric by the second layer.

* * * * *